US010009523B2

(12) United States Patent
Park et al.

(10) Patent No.: US 10,009,523 B2
(45) Date of Patent: Jun. 26, 2018

(54) ELECTRONIC MODULE AND METHOD OF MANUFACTURING THE SAME

(71) Applicant: SAMSUNG ELECTRO-MECHANICS CO., LTD., Suwon-si (KR)

(72) Inventors: Heung Woo Park, Suwon-si (KR); Jung Gon Choi, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 123 days.

(21) Appl. No.: 15/131,432

(22) Filed: Apr. 18, 2016

(65) Prior Publication Data

US 2016/0337561 A1 Nov. 17, 2016

(30) Foreign Application Priority Data

May 11, 2015 (KR) ............... 10-2015-0065132
Jul. 29, 2015 (KR) ............... 10-2015-0107472

(51) Int. Cl.
*H04N 5/225* (2006.01)
*H01L 31/0203* (2014.01)

(52) U.S. Cl.
CPC ....... *H04N 5/2253* (2013.01); *H01L 31/0203* (2013.01); *H04N 5/2257* (2013.01); *G03B 2217/002* (2013.01); *H01L 2224/48091* (2013.01); *H01L 2924/16235* (2013.01); *H04N 5/2252* (2013.01)

(58) Field of Classification Search
CPC .......... G03B 2217/002; H01L 31/0203; H04N 5/2252; H04N 5/2253; H04N 5/2257
See application file for complete search history.

(56) References Cited

U.S. PATENT DOCUMENTS

| | | | | |
|---|---|---|---|---|
| 6,777,767 | B2* | 8/2004 | Badehi | B81B 7/0067 257/414 |
| 6,930,398 | B1* | 8/2005 | Sun | H01L 27/14618 257/729 |
| 2004/0164981 | A1* | 8/2004 | Fujita | H01L 27/14618 345/418 |
| 2005/0264677 | A1* | 12/2005 | Uchida | H01L 27/14618 348/340 |
| 2006/0043513 | A1* | 3/2006 | Kim | H01L 27/14618 257/433 |
| 2006/0093352 | A1* | 5/2006 | Webster | G02B 7/025 396/529 |

(Continued)

FOREIGN PATENT DOCUMENTS

JP 7-202152 A 8/1995
JP 2987455 B2 10/1999

(Continued)

OTHER PUBLICATIONS

Korean Office Action issue in counterpart Korean application No. 10-2015-0107472 dated Feb. 6, 2017 (9 pages in English, 6 pages in Korean).

*Primary Examiner* — Amy Hsu
(74) *Attorney, Agent, or Firm* — NSIP Law (57) ABSTRACT

An electronic module includes a mounting surface, a cover disposed above the mounting surface, wherein the cover includes a protruding portion extending from a lower surface of the cover to a predetermined distance, and an adhesion part adhering the protruding portion to the mounting surface.

20 Claims, 7 Drawing Sheets

A-A

(56) References Cited

U.S. PATENT DOCUMENTS

| | | | | |
|---|---|---|---|---|
| 2006/0221225 A1* | 10/2006 | Tsukamoto | ....... | H01L 27/14618 348/340 |
| 2006/0268144 A1* | 11/2006 | Tan | ................... | H01L 27/14618 348/340 |
| 2008/0252771 A1* | 10/2008 | Wu | ...................... | H04N 5/2254 348/340 |
| 2009/0098683 A1* | 4/2009 | Negishi | ............. | H01L 27/14618 438/114 |
| 2009/0200630 A1* | 8/2009 | Yamamoto | ........ | H01L 27/14618 257/434 |
| 2009/0225431 A1* | 9/2009 | Lee | .......................... | G02B 7/02 359/621 |
| 2009/0267170 A1* | 10/2009 | Chien | ............... | H01L 27/14618 257/434 |
| 2009/0273047 A1* | 11/2009 | Yamamoto | ........ | H01L 27/14618 257/432 |
| 2011/0267534 A1* | 11/2011 | Tsai | ..................... | H04N 5/2253 348/374 |
| 2012/0032284 A1* | 2/2012 | Dejima | .................. | C09J 163/10 257/415 |
| 2014/0098274 A1* | 4/2014 | Asakura | ................. | G03B 17/02 348/333.05 |
| 2015/0062420 A1* | 3/2015 | Borthakur | ............ | H04N 5/2253 348/373 |
| 2015/0358538 A1* | 12/2015 | Donaldson | ............ | G03B 17/02 348/38 |

FOREIGN PATENT DOCUMENTS

| | | |
|---|---|---|
| JP | 2002-76154 A | 3/2002 |
| JP | 2010-252164 A | 11/2010 |
| KR | 10-0604190 B1 | 7/2006 |
| KR | 10-2007-0041572 A | 4/2007 |
| KR | 10-0705349 B1 | 4/2007 |
| KR | 10-0994845 B1 | 11/2010 |
| KR | 10-2013-0076287 A | 7/2013 |
| KR | 10-1317983 B1 | 10/2013 |
| KR | 10-1378948 B1 | 4/2014 |

* cited by examiner

ELECTRONIC MODULE AND METHOD OF MANUFACTURING THE SAME

CROSS-REFERENCE TO RELATED APPLICATION

This application claims the benefits under 35 USC 119(a) of Korean Patent Application Nos. 10-2015-0065132 filed on May 11, 2015, and 10-2015-0107472, filed on Jul. 29, 2015, with the Korean Intellectual Property Office, the entire disclosures of which are incorporated herein by reference for all purposes.

BACKGROUND

1. Field

The following description relates to an electronic module in which at least two components are stacked, a method of manufacturing the same, and a camera module including the same.

2. Description of Related Art

An image sensor and electronic module converts an optical signal including image information or distance (or depth) information related to a subject into an electrical signal.

An image sensor assembly normally includes an image sensor, a housing sealing the image sensor, and a filter (for example, an infrared filter) coupled to the housing and filtering a specific component of incident light introduced into the image sensor. However, in the image sensor package according to the related art described above, the filter is coupled to the housing, such that there is a limitation on significantly reducing an interval between the filter and the image sensor. As a result, an overall thickness of the image sensor assembly is also increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic module includes a mounting surface, a cover disposed above the mounting surface, wherein the cover includes a protruding portion extending from a lower surface of the cover to a predetermined distance, and an adhesion part adhering the protruding portion to the mounting surface.

The adhesion part may include a lower adhesion part interposed between the protruding portion and the mounting surface, and an outer adhesion part formed on an outer side surface of the protruding portion. A lower end of the outer adhesion part may be connected to the lower adhesion part, and an upper end of the outer adhesion part may be adhered to an adhesion surface of the cover. The upper end of the outer adhesion part may be thicker than the lower adhesion part.

The protruding part may have a quadrangular frame shape, and may include an accommodating groove formed in at least one corner. The protruding part may include at least one vent hole through which air of an internal space is discharged.

The mounting surface may be an upper surface of an image sensor, the image sensor may include electrodes disposed along a perimeter of an effective pixel region, and the protruding part may be a spacer disposed between the effective pixel region and the electrodes. A masking part may be formed on one surface of the cover and may be configured to block a portion of light from being introduced into the effective pixel region of the image sensor.

The protruding part may include stacked resin layers.

A metal layer may be interposed between the protruding part and the cover to increase a coupling force between the protruding part and the cover.

An alignment mark may be formed on one surface of the cover and may be configured to measure flatness of the cover.

The electronic device may include a sound device disposed on the mounting surface, and a second adhesion part may adhere the sound device to the mounting surface.

In another general aspect, a method of manufacturing an electronic module, includes dipping into an adhesive a lower end surface of a second component having an internal space, disposing the second component onto a first component; and curing the adhesive to form a bond between the first component and the second component.

The first component may be an image sensor, and the second component may be a transparent cover having a spacer attached to a lower surface thereof.

The curing of the adhesive may include applying heat to the adhesive or irradiating the adhesive with ultraviolet radiation.

The first component may also be a package substrate, and the second substrate may be a micro electro mechanical systems (MEMS) device manufactured in a MEMS process.

The method may further include dipping into an adhesive a cover and disposing the dipped cover onto the package substrate.

The method may further include dipping a third component into an adhesive, and disposing the third component onto the first component, wherein the first component may be a substrate, the second component may be a sound device, and the third component may be a cover comprising a protrusion extending from a lower surface of the cover.

In another general aspect, a camera module includes a substrate, a housing disposed on the substrate, an electronic module disposed on the substrate and within the housing, and a lens part including at least one lens disposed in the housing. The electronic module includes an image sensor, a cover disposed above the image sensor, wherein the cover includes a spacer extending from a lower surface of the cover at a predetermined distance, and an adhesion part adhering the spacer to the image sensor.

The spacer may be a rectangular frame disposed between a perimeter of an effective pixel region of the image sensor and an outer perimeter of the cover.

The adhesion part may include an inner adhesion part disposed on an inner surface of the spacer extending between the cover and the image sensor, a lower adhesion part disposed on an entire a lower surface of the spacer, and an outer adhesion part disposed on an outer surface of the spacer and lower surface of the cover, and extends between the cover and the image sensor, wherein an upper portion of the outer adhesion part may be thicker than a lower portion of the adhesion part.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the following description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

In an electronic module according to one or more embodiments, a second component may be stacked on and bonded to a first component. Here, the first component and the second component may include all components included in the electronic module, such as an electronic device, a substrate, or an optical filter.

Figure 1:
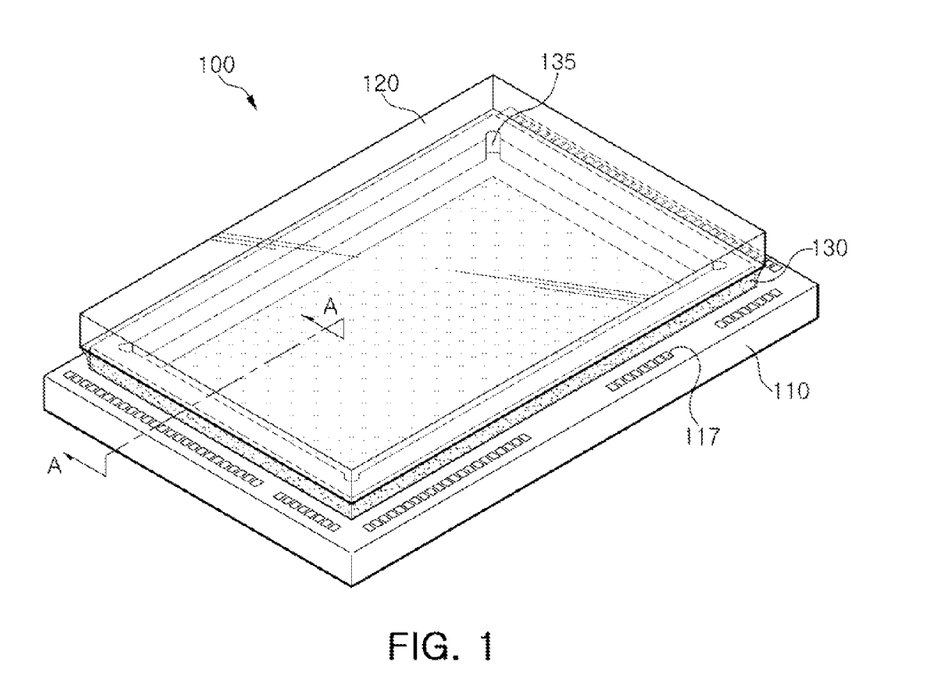
FIG. 1 is a perspective view schematically illustrating an electronic module according to an embodiment.

FIG. 1 is a perspective view schematically illustrating an electronic module according to an embodiment. In addition, FIG. 2 is a cross-sectional view taken along line A-A of FIG. 1; and FIG. 3 is a cross-sectional plan view taken along line B-B of FIG. 2.

Figure 2:
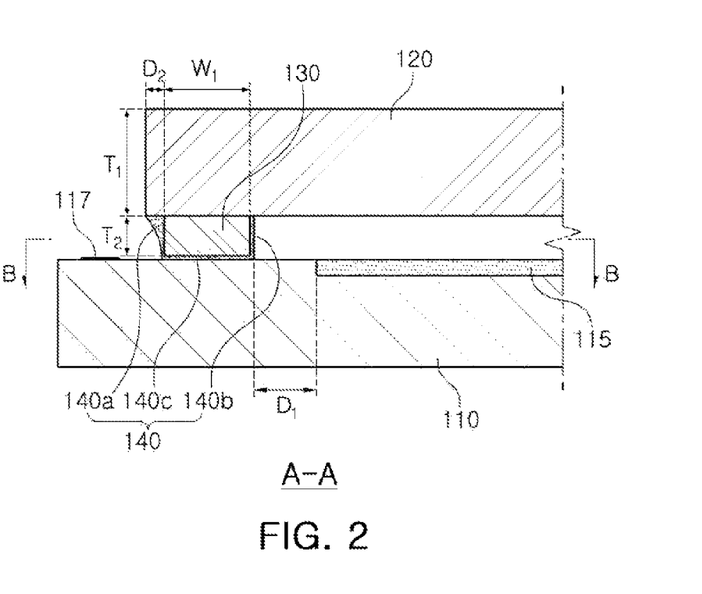
FIG. 2 is a cross-sectional view taken along line A-A of FIG. 1.
Figure 3:
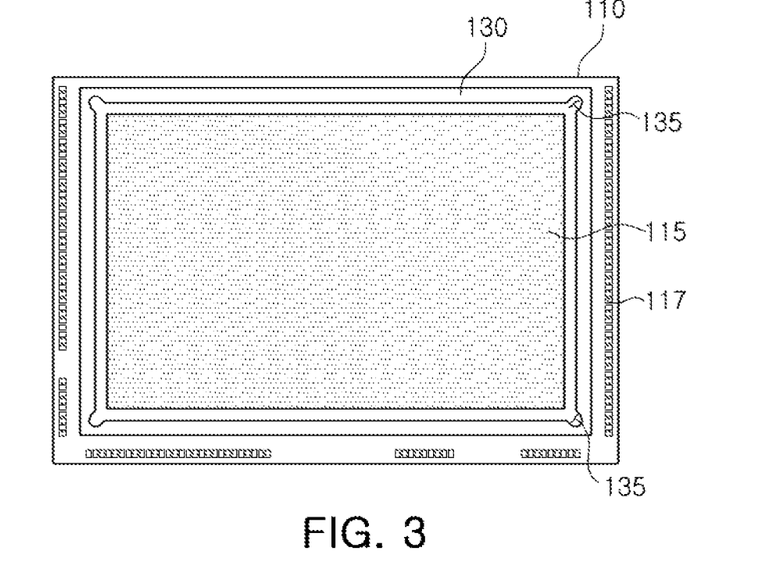
FIG. 3 is a cross-sectional plan view taken along line B-B of FIG. 2.

Referring to FIGS. 1 through 3, the electronic module according to one or more embodiments, an image sensor assembly 100, includes an image sensor 110 and a cover 120.

The image sensor 110 may be the the first component and may be formed of a chip having a rectangular shape. For example, a bare chip obtained by cutting a semiconductor wafer may be used as the image sensor 110.

An effective pixel region 115 converting a photo-image of a subject formed by an optical system, or lens part 30 (see FIG. 7), into an electrical signal, and electrodes 117 transmit the signal obtained from the effective pixel region 115 externally. The electrodes 117 may be formed on an upper surface of the image sensor 110. Here, as illustrated in FIG. 3, the electrodes 117 are disposed outwardly of the effective pixel region 115 along a circumference of the effective pixel region 115.

The cover 120 may be the second component, and is disposed above the effective pixel region 115 of the image sensor 110, and filters a specific component of incident light introduced into the image sensor 110. The cover 120 is disposed above the effective pixel region 115 so that the cover 120 is spaced apart from the effective pixel region 115, but next to the effective pixel region 115 as close as possible.

The cover 120 is adhered to the upper surface of the image sensor 110 through a spacer 130. Therefore, a distance between the cover 120 and the image sensor 110 may be defined by a height of the spacer 130.

The cover 120 may be formed of a transparent material that may transmit light for forming an image onto the image sensor 110. The cover 120 may be a cut-off filter (for example, an infrared cut-off filter (IRCF)) preventing ultraviolet (UV), infrared light, or other light outside the visible spectrum from passing into the image sensor 110. For example, a blue glass (or a blue filter) for an infrared cut-off filter or a film filter may be used as the cover 120 according to an embodiment. However, a material of the cover 120 is not limited thereto. That is, various materials may be used as the material of the cover 120 as long as they allow light for forming an image to be transmitted and incident to the effective pixel region 115 of the image sensor 110 and seal the effective pixel region 115.

The spacer 130 is formed on a lower surface of the cover 120. The spacer 130 may have a continuous ring shape along a contour of the effective pixel region 115. In an embodiment, the effective pixel region 115 has a quadrangular shape, thus the spacer 130 may also have a quadrangular frame shape. Therefore, in a case in which the effective pixel region 115 is formed to have another shape, the spacer 130 may also be formed in a shape corresponding to the shape of the effective pixel region 115.

The spacer 130 is bonded between the effective pixel region 115 and the electrodes 117 of the image sensor 110. Therefore, the image sensor assembly 100 according to an embodiment may be divided into an internal space in which the effective pixel region 115 is disposed and an external space on which the electrodes 117 are disposed, by the cover 120 and the spacer 130.

The spacer 130 may be sized to be spaced apart from the effective pixel region 115 by a predetermined distance (for example, 50 μm) and may also be spaced apart from the electrodes 117 by a predetermined distance. This prevents an adhesion surface of an adhesion part 140, described below, from contacting the effective pixel region 115 or the electrodes 117. Therefore, the above-mentioned distance may be significantly reduced as long as the adhesion surface described above is significantly reduced and does not contact the effective pixel region 115 or the electrodes 117.

An outer perimeter of the spacer 130 is smaller than that of an outer perimeter of the cover 120. In addition, the spacer 130 is spaced apart from the outer edge of the cover 120 by a predetermined distance $D_2$, for example, 25 μm.

The spacer 130 may be formed beneath the cover 120 using a dry film photo-resist (DFR) or a photo-resist (PR). Therefore, both side surfaces of the spacer 130 are perpendicular to an upper surface or a lower surface of the spacer 130 or may be inclined to the upper surface or the lower surface of the spacer 130. In addition, the spacer 130 may be made from an epoxy or polyimide based resin material. However, the material of the spacer 130 is not limited thereto and may be varied. In addition, the spacer 130 according to one or more embodiments may be formed of a material that does not contain a filler. Here, the filler means particles having a diameter of 1 μm or more. For example, silica, Talc, or $Ba_2SO_4$, may be used as the filler.

In a case in which the filler having the diameter of 1 μm or more is contained in the spacer 130, for example, the filler may act as a foreign material which may cause product defects. Therefore, the spacer 130 according to one or more embodiments may contain particles having a diameter less than 1 μm.

The upper surface of the spacer 130 are adhered to the lower surface of the cover 120, and the lower surface of the spacer 130 are adhered to the upper surface of the image sensor 110. Here, the spacer 130 and the image sensor 110 are adhered to each other through the adhesion part 140.

An internal space of the spacer 130 has an opening for allowing light to pass. In addition, the internal space of the spacer 130 may be a closed space. In other words, the internal space is sealed from the surrounding environment. In this case, since the effective pixel region 115 is protected from the surrounding environment, even in the case that the image sensor assembly 100 is cleaned using water in a process of manufacturing the image sensor assembly 100, the water may not permeate into the effective pixel region 115. Therefore, a cleaning process may be easily performed. However, the spacer 130 is not limited thereto and may be varied.

The adhesion part 140 according to one or more embodiments may be a thermosetting adhesive or a photosensitive adhesive, but is not limited thereto. In addition, the adhesion part 140 may be formed on the side surfaces of the spacer 130 as well as on the lower surface of the spacer 130, as illustrated in FIG. 2.

Referring to FIG. 2, the adhesion part 140 includes a lower adhesion part 140c disposed on the lower surface of the spacer 130, an inner adhesion part 140b disposed on an inner side surface of the spacer 130, and an outer adhesion part 140a disposed on an outer side surface of the spacer 130. In addition, the inner adhesion part 140b and the outer adhesion part 140a are be adhered to the lower surface of the cover 120. Therefore, the adhesion part 140 is formed on all exposed surfaces of the spacer 130, and extends along the surfaces of the spacer 130 to contact the lower surface of the cover 120 as well as the spacer 130.

The inner side surface of the spacer 130 includes any side surface disposed adjacent to the effective pixel region 115, extending from the lower surface of the cover 120 toward the image sensor 110. In addition, the outer side surface of the spacer 130, a side surface opposite to the inner side surface described above, includes any side surface disposed adjacent to the electrodes 117 of the image sensor 110.

The outer adhesion part 140a may also be adhered to the lower surface of the cover 120. For example, a lower end of the outer adhesion part 140a is connected to the lower adhesion part 140c, and an upper end of the outer adhesion part 140a may be adhered to the lower surface of the cover 120. An adhesion surface between the outer adhesion part 140a and the cover 120 may be an entire lower surface of the cover 120 between the spacer 130 and a side surface (or a lower edge) of the cover 120. For example, referring to FIG. 2, the entire lower surface of the cover 120 disposed outwardly of the spacer 130 is used as the adhesion surface between the outer adhesion part 140a and the cover 120. An adhesion portion between the outer adhesion part 140a and the image sensor 110 may be significantly smaller than the adhesion surface between the outer adhesion part 140a and the cover 120. In the alternative, the outer adhesion part 140a may be connected to the lower adhesion part 140c, without having an adhesion surface. Therefore, the outer adhesion part 140a may be thickest at a portion thereof adjacent to the cover 120, and the thickness may reduce as the outer adhesive part 140a extends toward the image sensor 110.

The inner adhesion part 140b is also adhered, or bonded, to the lower surface of the cover 120. The inner adhesion part 140b is generally thinner than that of the outer adhesion part 140a, and an adhesion surface of the inner adhesion part 140b adhered to the cover 120 also has a relatively small area. However, the inner adhesion part 140b is not limited thereto and may be varied. That is, in some cases, the inner adhesion part 140b may also be thicker than that of the outer adhesion part 140a.

Since an edge of the lower surface of the cover 120 according to one or more embodiments is adjacent to the outer side surface of the spacer 130, when an adhesive 5 (see FIG. 5) for forming the adhesion part 140 is applied to the spacer 130, the adhesive may extend up to the edge of the lower surface of the cover 120. In addition, a shape of the adhesive may be maintained until the adhesive is hardened, or cured, by surface tension, such that the outer adhesion part 140a coats the entire outer surface of the spacer 130 and extends along the lower surface up to an outer edge of the cover 120.

Alternatively, after the adhesive described above is applied to only the spacer 130, the adhesive, of which a viscosity is reduced by application of heat, may be distributed along surfaces of the spacer 130 and the cover 120, such that the configurations of the outer adhesion part 140a and the inner adhesion part 140b described above may be achieved. In other words, an adhesive is applied to the spacer 130, then heat is applied to the adhesive 130 in order to reduce the viscosity of the adhesive allowing the adhesive to be distributed along the surfaces of the spacer 130 and the cover 120 resulting in an adhesion part 140 having the configuration described above and illustrated in FIG. 2.

The lower adhesion part 140c is formed on the lower surface of the spacer 130. In detail, the lower adhesion part 140c includes a thin film formed between the lower surface of the spacer 130 and the upper surface of the image sensor 110 to adhere the spacer 130 to the image sensor 110. The lower adhesion part 140c may have an area substantially similar to that of the lower surface of the spacer 130, as illustrated in FIG. 2. Therefore, an adhesion surface between the lower adhesion part 140c and the image sensor 110 may also have an area substantially similar to that of the lower surface of the spacer 130. Here, the substantially similar area means an area that is the same as or slightly different from that of the lower surface of the spacer 130, as illustrated in FIG. 2. For example, the area of the adhesion surface described above have an area slightly greater than, slightly less than or equal to the area of the lower surface of the spacer 130 by a thickness of the lower adhesion part 140c. However, the area of the adhesion surface is not limited thereto and may be varied.

As described above, a configuration in which the adhesion surface of the lower adhesion part 140c has the area substantially similar to that of the lower surface of the spacer 130 may be implemented by a method of manufacturing an image sensor assembly 100 according to an embodiment. In addition, since the adhesion surface of the lower adhesion part 140c has the area substantially similar to that of the lower surface of the spacer 130, distances between the adhesion part 140 and the effective pixel region 115 and the electrodes 117 of the image sensor 110 may be significantly reduced. This will be described below.

The adhesion part 140 and the effective pixel region 115 or the electrodes 117 of the image sensor 110 need to be spaced apart from each other by a predetermined distance (for example, $D_1$ of FIG. 2) in order to significantly reduce defects of the image sensor assembly at the time of manufacturing the image sensor assembly. This has been undertaken in order to significantly reduce adhesive for forming the adhesion part 140 from being introduced onto or splashed on the effective pixel region 115 or the electrodes 117. Therefore, as a width of the adhesion surface of the lower adhesion part 140c increases, a distance between the effective pixel region 115 and the electrodes 117 increases accordingly. However, in the adhesion part 140 according to one or more embodiments, the adhesion surface described above does not extend significantly beyond the spacer 130, but may have a size substantially corresponding to the area of the lower surface of the spacer 130. Therefore, the width of the adhesion surface may be significantly reduced, such that the distance between the effective pixel region 115 and the electrodes 117 of the image sensor 110 may also be significantly reduced.

Therefore, the adhesion surface between the adhesion part 140 and the image sensor 110 may be formed by the lower adhesion part 140c, and the adhesion surface between the adhesion part 140 and the cover 120 may be substantially formed by the outer adhesion part 140a.

The structure of the adhesion part 140 described above may be implemented by a method of manufacturing an image sensor assembly as described below.

Additionally, the inner adhesion part 140b and the outer adhesion part 140a may be partially formed on the side surfaces of the spacer 130 depending on an amount by which the adhesive for forming the adhesion part 140 is applied to the spacer 130 in the process of manufacturing the image sensor assembly. In this case, the outer adhesion part 140a or the inner adhesion part 140b is not adhered to the cover 120. In addition, in some cases, the inner adhesion part 140b formed on the inner side surface of the spacer 130 may have a very small size or may not be formed. For example, the adhesion part 140 may only include the lower adhesion part 140c disposed on the lower surface of the spacer 130 and the outer adhesion part 140a disposed on the outer side surface of the spacer 130. This structure may be formed by allowing air within in an internal cavity of the image sensor assembly 100 to push the adhesive applied to the inner side surface of the spacer 130 outwardly while being expanded as heat is applied to the adhesive during the curing of the adhesive in the process of manufacturing the image sensor assembly 100.

In addition, accommodating grooves 135 may be formed in respective corner portions of in the spacer 130 according to an embodiment having a quadrangular shape, as illustrated in FIGS. 1 and 3. The accommodating grooves 135 may be formed in the inner side surface of the spacer 130 to reduce a width in corners of the spacer 130.

Although a case in which the accommodating grooves 135 are formed in all of four corner portions has been described by way of example, the accommodating grooves 135 are not limited thereto, but may also be selectively formed at any one corner portion or several corner portions, as desired. In addition, although a case in which the accommodating grooves 135 are only formed in the corner portions has been described by way of example, the accommodating grooves 135 are not limited thereto. That is, at least one accommodating groove 135 may also be formed in a linear portion in addition to the corner portions, if desired.

The accommodating grooves 135 prevent a surplus of the adhesive from being collected in the corner portions of the spacer 130 to flow into the effective pixel region 115, during the manufacturing of the image sensor assembly 100. Since the accommodating grooves 135 are formed in the spacer 130, the surplus of the adhesive are introduced into and hardened in the accommodating grooves 135 of the spacer 130 in during manufacturing the image sensor assembly. Therefore, an unwanted increase of the adhesion surface of the lower adhesion part 140c due to diffusion of the adhesive externally of the spacer 130 in the corner portions may be significantly reduced.

In the image sensor assembly 100 according to one or more embodiments as described above, the adhesion surface between the adhesion part 140 and the image sensor 110 is formed by the lower adhesion part 140c disposed on the lower surface of the spacer 130, and has an area substantially similar to that of the lower surface of the spacer 130. Therefore, since the adhesion part 140 does not extend substantially beyond the lower surface of the spacer 130, the distance between the effective pixel region 115 and the electrodes 117 formed in the image sensor 110 is significantly reduced, such that a size of the image sensor 110 or the image sensor assembly 100 is also significantly reduced.

In addition, since the cover 120 is not coupled to a housing as in the related art, but is instead directly adhered to the image sensor 110, a distance between the cover 120 and the image sensor 110 is significantly reduced, such that a height (or a thickness) of the image sensor assembly 100 may also be reduced.

Further, according to one or more embodiments, the adhesion part 140 is formed on the inner and outer side surfaces of the spacer 130 and also adhered to the cover 120, thereby increasing reliability of adhesion between the cover 120 and the image sensor 110.

Further, since the surrounding space of the effective pixel region 115 is sealed by the cover 120, the spacer 130, and the adhesion part 140, a water cleaning process for removing a foreign material may be used after the cover 120 is attached, thereby increasing a production yield.

Next, a method of manufacturing an image sensor assembly according to one or more embodiments will be described.

Figure 4:
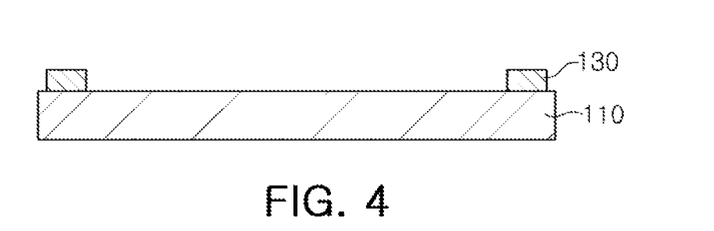
FIGS. 4 through 6 are views illustrating a method of manufacturing an image sensor assembly according to an embodiment.
Figure 5:
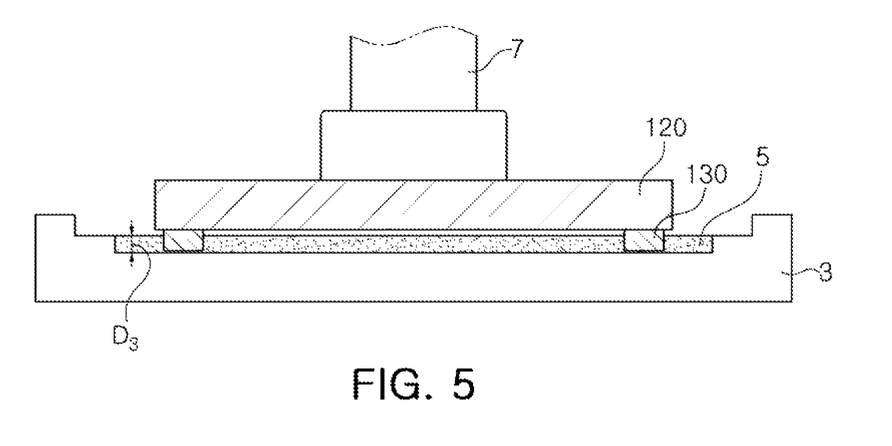
Figure 6:
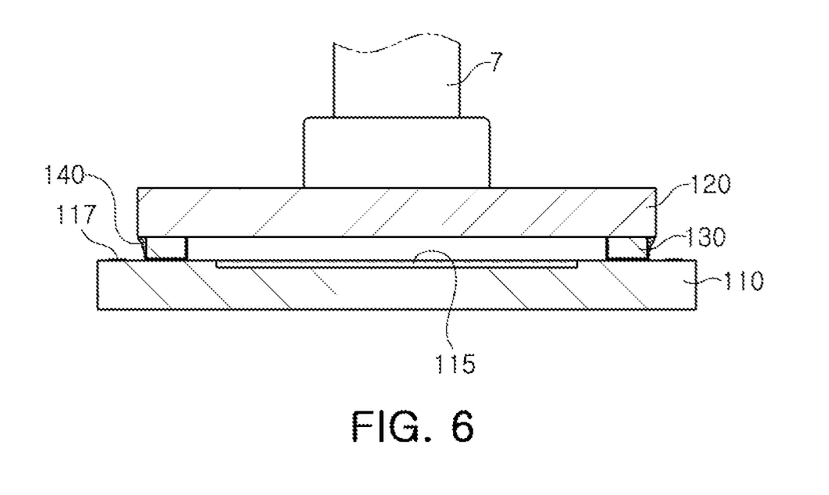

FIGS. 4 through 6 are views illustrating a method of manufacturing an image sensor assembly according to one or more embodiments.

Referring to FIGS. 4 through 6, a spacer 130 is formed on a cover 120, as illustrated in FIG. 4. The spacer 130 may be formed by a printing method, a dispensing method, or a photolithography method. For example, the spacer 130 may be formed by forming a dry film photo-resist (DFR) on one surface of the cover 120 and then partially removing the DFR through photolithography. However, the spacer 130 is not limited to being formed as described above.

Here, a width or a thickness of the spacer 130 is determined to correspond to a size of the cover 120. In the an embodiment, as illustrated in FIG. 2, a width $W_1$ and a height $T_2$ of the spacer 130 may be 135 μm and 50 μm, respectively. The cover 120 may have a thickness $T_1$ of 210 μm or less. The spacer 130 is spaced from the edge of the lower surface of the cover 120 by a distance $D_2$. The distance $D_2$ may be 25 μm. However, the width and the thickness of the spacer 130 and the distance between the spacer 130 and the edge of the lower surface of the cover 120 are not limited thereto, but may be variously modified, as desired.

As illustrated in FIG. 5, the adhesive 5 is applied to the spacer 130. Here, the adhesive 5 may be applied through dipping. In more detail, a dipping container 3 is filled with adhesive 5 and a portion of the spacer 130 is dipped into the adhesive 5. A transfer member 7 is used to dip a distal end of the spacer 130 into the adhesive 5.

An internal depth $D_3$ of the dipping container 3 in which the adhesive 5 is accommodated may be less than the thickness $T_2$ of the spacer 130. Therefore, even though the distal end (that is, the lower surface) of the spacer 130 contacts a bottom surface of the dipping container 3, the adhesive 5 is applied to the spacer 130 without being applied to the cover 120.

In a case in which a viscosity of the adhesive 5 is low (for example, 1,000 cps or less), the adhesive 5 may be splashed onto the cover 120 when introducing the spacer 130 to the adhesive 5, thereby causing a defect. In addition, in a case in which a viscosity of the adhesive 5 is too high (for example, greater than 100,000 cps), excessive adhesive 5 may be applied to the spacer 130, such that the adhesion surface extends substantially beyond the spacer 130 or the adhesive 5 may not be uniformly applied to the surface of the spacer 130. Therefore, an adhesive having a viscosity in a range of 1,000 cps to 100,000 cps may be used as the adhesive 5 to overcome the above mentioned defects.

In the following description, an example only, the dipping container 3 is formed to a depth $D_3$ of 30 μm to correspond to height $T_2$ a 50 μm of the spacer 130 and the adhesive 5 has a viscosity of 50,000 cps. However, a depth $D_3$ of the dipping container 3, height $T_2$ of the spacer 130 and a viscosity of the adhesive 5 are not limited thereto, and may be varied.

As illustrated in FIG. 6, the cover 120 and the spacer 130 to which the adhesive 5 is applied his adhered, or bonded, to the image sensor 110. Here, the spacer 130 to which the adhesive 5 is applied is disposed on the image sensor 110, and the adhesive 5 is hardened, or cured.

In a process of disposing the spacer 130 with the adhesive 5 on the image sensor 110, a surplus of the adhesive 5 applied to the spacer 130 may be collected in the corner portions of the spacer 130. This adhesive is introduced into and stored in the accommodating grooves 135 (see FIG. 3) formed in the spacer 130. Therefore, the surplus of the adhesive 5 flowing into the effective pixel region 115 along the upper surface of the image sensor 110 may be suppressed or prevented.

The adhesive 5 is then hardened, or cured, completing the image sensor assembly 100 illustrated in FIG. 1. In the process of hardening, or curing, the adhesive 5, various methods may be used depending on a kind of adhesive 5. For example, in a case in which the adhesive 5 is a thermosetting solution, heat is applied to the adhesive 5 to harden the adhesive 5, and in a case in which the adhesive is an ultraviolet (UV) curable solution, to the adhesive 5 is irradiated with ultra-violate (UV) light to harden the adhesive. In addition, a material that does not contain a volatile material such as an organic solvent may also be used as the adhesive 5.

Alternatively, a method of adhering the spacer 130 and the image sensor 110 by applying the adhesive to the upper surface of the image sensor 110 in a dispensing scheme rather than the dipping scheme and then seating the spacer 130 on the adhesive may also be used. However, in this case, it may be difficult to apply the adhesive up the side surfaces of the spacer 130 or up to the lower surface of the cover 120. In addition, since the adhesive is directly applied to the image sensor 110, the adhesive may diffuse along the surface of the image sensor 110, such that the adhesion surface between the adhesion part 140 and the image sensor 110 extends substantially beyond the spacer 130. Further, the adhesive may not be linearly or evenly applied, resulting in a meandering application with round beads applied in corner portions. Thus, the adhesive is not accurately positioned between the lower surface of the spacer 130 and the image sensor 110, and may significantly extend externally beyond the spacer 130.

In addition, in a case of using the dispensing scheme, since a tolerance is generated between a position to which the adhesive is applied and a position of the spacer, the adhesive may inevitably be applied at a wide width in order to secure adhesion between the spacer 130 and the image sensor 110. As a result, in the dispensing scheme, the adhesion surface of the adhesion part 140 may be formed at different sizes. In addition, since the adhesion surface between the image sensor 110 and the adhesion part 140 extends substantially beyond the edges of the spacer 130 in the case of using the dispensing scheme, the distance $D_1$ between the spacer 130 and the effective pixel region 115 is relatively large.

However, in a case of using the dipping scheme as in the one or more embodiments, since the adhesive is applied to the surface of the spacer 130 rather than to the image sensor 110, adhesive flowing along the surface of the image sensor 110 may be significantly reduced. In addition, alignment between the applied adhesive 5 and the spacer 130 is not required, and an adhesion area of the adhesion part 140 has a size substantially similar to that of the lower surface of the spacer 130. Therefore, the distance $D_1$ between the spacer 130 and the effective pixel region 115 may be significantly reduced.

Although a case in which a horizontal distance $D_1$ between the spacer 130 and the effective pixel region 115 is 50 μm has been described, by way of example only, in reference to FIG. 2, the horizontal distance $D_1$ between the spacer 130 and the effective pixel region 115 may also be greater than, less than, or equal to 50 μm as desired.

In the method of manufacturing an image sensor assembly according to one or more embodiments described above, the adhesion part 140 is formed using the adhesive 5, thereby obtaining strong adhesion regardless of ruggedness of the surface of the image sensor 110. In addition, since the adhesive 5 is applied directly to the spacer 130 through dipping, the adhesive 5 may be very rapidly applied, thereby increasing productivity.

Figure 7:
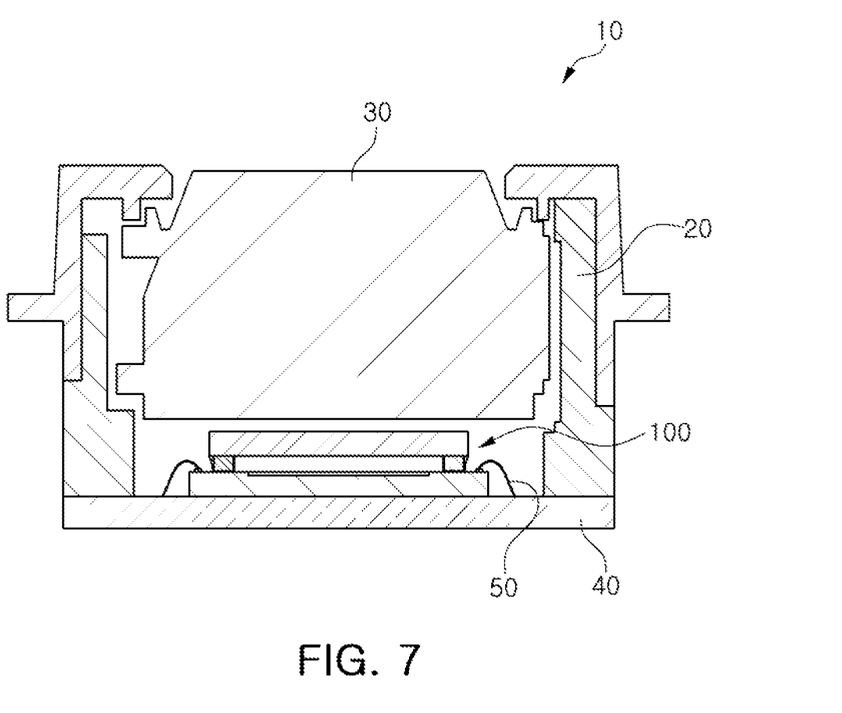
FIG. 7 is a cross-sectional view schematically illustrating a camera module according to an embodiment.

FIG. 7 is a cross-sectional view schematically illustrating a camera module according to an embodiment. Referring to FIG. 7, a camera module 10 according to one or more embodiments includes the image sensor assembly 100 described above, a substrate 40, a housing 20, and the lens part 30 coupled to the housing 20.

The substrate 40 has a wiring formed thereon, and the image sensor 110 may be disposed on an upper surface of the substrate 40. External connection terminals such as a conductive pad and a pin electrically connected to the image sensor 110 may be formed on the substrate 40. A case in which the substrate 40 and the image sensor 110 are electrically connected to each other by a bonding wire 50 has been described by way of example only according to one or more embodiments. However, a method of connecting the substrate 40 and the image sensor 110 to each other is not limited thereto, but may be varied. For example, the substrate 40 and the image sensor 110 may be connected to each other in a flip-chip bonding scheme.

Various types of substrates such as a printed circuit board (PCB), a flexible substrate, a ceramic substrate, or a glass substrate may be used as the substrate 40 according to one or more embodiments as long as wirings are formed thereon.

The lens part 30 includes one or more lenses, and is coupled to the housing 20. Here, the lens part 30 may be coupled to the housing 20 so that the lens or the entire lens part 30 is movable in order to focus an optical system.

The housing 20 includes an internal space so that the lens part 30 is accommodated therein, and supports the lens part 30. In addition, the substrate 40 is coupled to a lower end of the housing 20. Here, the substrate 40 is coupled to the housing 20 so that the image sensor assembly 100 is accommodated in the housing 20.

A cover 120 of the camera module, according to one or more embodiments as described above, is not attached to the housing 20, but to the image sensor 110. Therefore, a thickness (or a height) of the camera module may be reduced as compared with the camera module according to the related art, wherein the cover is coupled to the housing. Thus, the camera module 10 may be easily mounted in a thin portable terminal.

Figure 8:
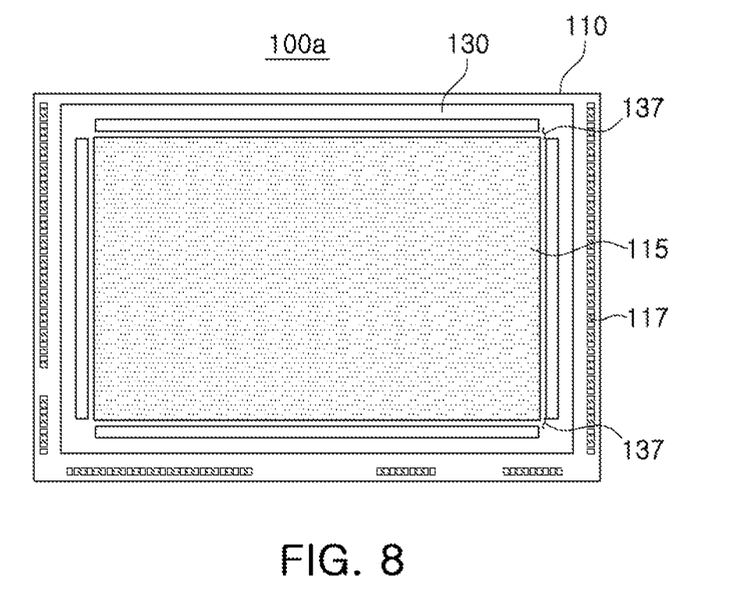
FIG. 8 is a plan view schematically illustrating an image sensor assembly according to another embodiment.

FIG. 8, a plan view schematically illustrating an image sensor assembly according to another embodiment, illustrates a plane corresponding to a cross section taken along line B-B of FIG. 2. Referring to FIG. 8, in an image sensor assembly 100a according to another embodiment, at least one vent hole 137 is formed in a spacer 130.

The vent hole 137 connects an internal space of the spacer 130 with an external environment. Therefore, gas present in the internal space of the spacer 130 may be discharged externally through the vent hole 137.

This configuration has been derived in order to prevent gas or air within in an internal space of the image sensor assembly 100 from being excessively expanded when heat is applied to the adhesive during the curing step of the manufacturing process for the image sensor assembly 100. In this embodiment, the vent hole 137 is formed in each of corner portions of the spacer 130 having a quadrangular shape. However, the shape, number, and position of vent holes 137 according to one or more embodiments are not limited as long as the vent holes 137 discharge the gas present in the internal space of the spacer 130 externally.

Figure 9:
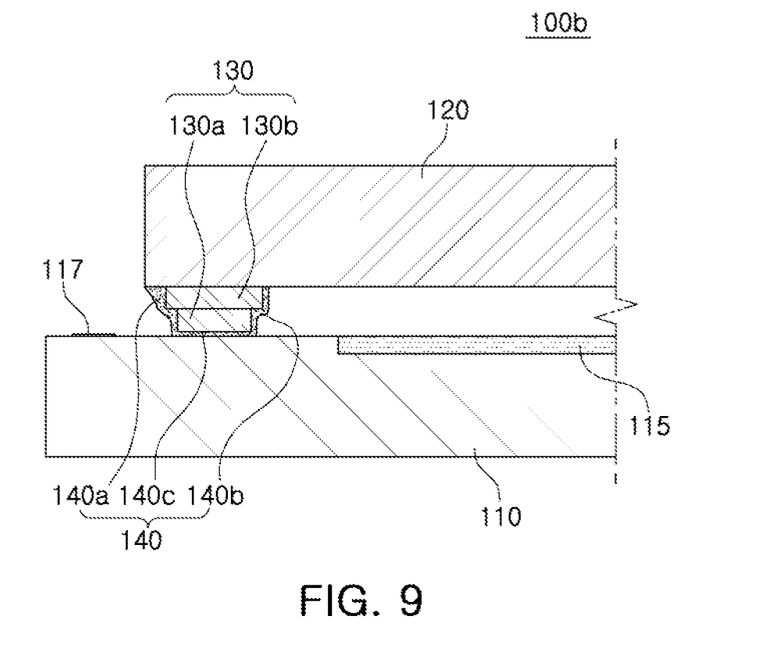
FIG. 9 is a cross-sectional view schematically illustrating an image sensor assembly according to another embodiment.

FIG. 9, a cross-sectional view schematically illustrating an image sensor assembly according to another embodiment, illustrates a cross section corresponding to a cross section taken along line A-A of FIG. 1.

Referring to FIG. 9, in an image sensor assembly 100b according to an embodiment, a spacer 130 may be formed by stacking multiple layers. The spacer 130 is formed by stacking two or more resin layers. Here, respective layers 130a and 130b may have different widths. Although a case in which a first layer 130a disposed at a lower portion has a width narrower than that of a second layer 130b disposed at an upper portion has been described by way of example, widths of the first and second layers 130a and 130b are not limited thereto, and may be varied. For example, the first layer 130a disposed at the lower portion may have a width wider than that of the second layer 130b disposed at the upper portion or may have the same width as that of the second layer 130b disposed at the upper portion.

In addition, in the spacer 130, the first layer 130a and the second layer 130b may be formed of the same material. However, the first layer 130a and the second layer 130b are not limited to being formed of the same material, but may also be formed of different materials.

Although a case in which the spacer 130 is formed of two layers has been described by way of example, the spacer 130b is not limited to being formed of the two layers, and may be formed of two or more layers, if desired. The spacer 130 may be manufactured using a dry film photo-resist (DFR), as described above. For example, the second layer 130b may be first formed by attaching the DFR to the cover 120 and then exposing the DFR, and the first layer 130a may be formed by again attaching the DFR to the second layer 130b and then exposing the DFR.

In this case, the first layer 130a and the second layer 130b may have the same width or different widths. However, the method for manufacturing the spacer 130 is not limited thereto. For example, the first layer 130a and the second layer 130 may be simultaneously formed by attaching two stacked DFRs to the cover 120 and then exposing the two stacked DFRs. In this case, the first layer 130a and the second layer 130b may have the same width.

In the image sensor assembly 100b, the spacer may be formed at a desired height. For example, in a case in which a desired height of the spacer is not implemented by only one layer, the spacer is formed of multiple layers, thereby obtaining a spacer 130 having a desired height.

In addition, a layer disposed at a lower portion among several resin layers configuring the spacer may be formed at a relatively narrow width, thereby significantly reducing the adhesion surface of the adhesion part.

Figure 10A:
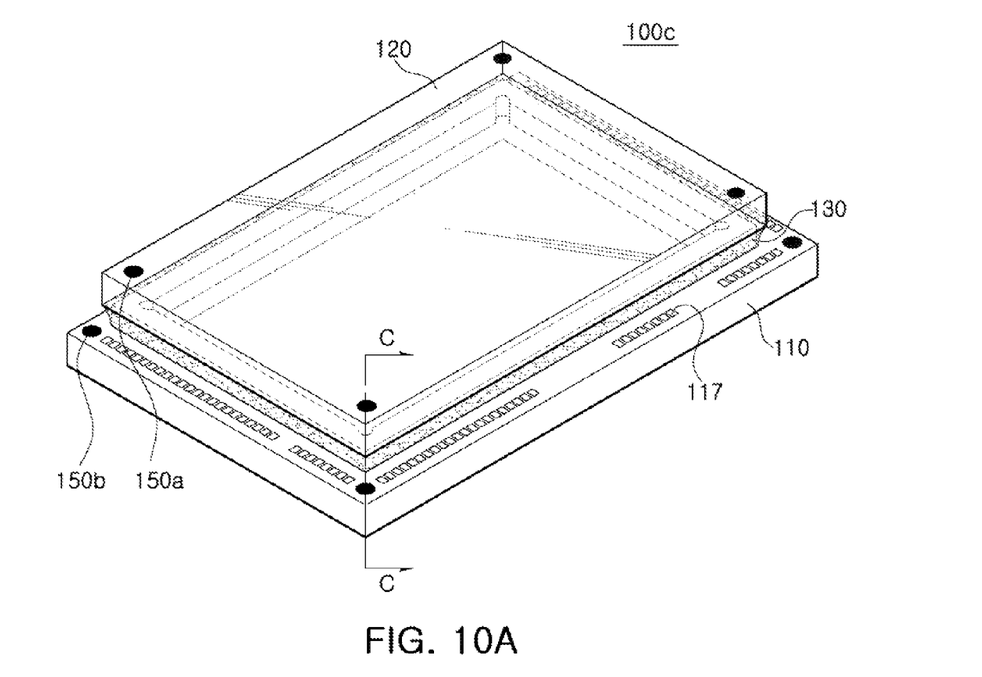
FIG. 10A is a perspective view schematically illustrating an image sensor assembly according to another embodiment.
Figure 10B:
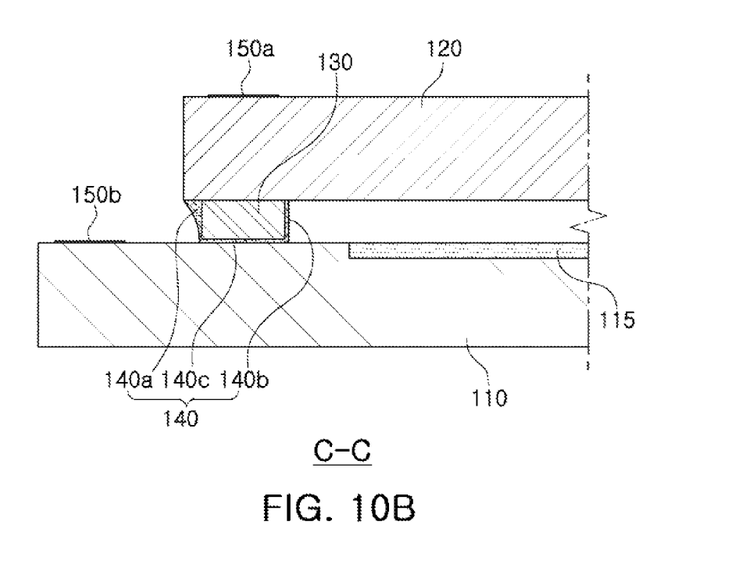
FIG. 10B is a cross-sectional view taken along line C-C of FIG. 10A.

FIG. 10A is a perspective view schematically illustrating an image sensor assembly according to another embodiment; and FIG. 10B is a cross-sectional view taken along line C-C of FIG. 10A.

Referring to FIGS. 10A and 10B, in an image sensor assembly 100c according to another embodiment, at least one alignment mark 150a is formed on an upper surface of the cover 120. In addition, at least one alignment mark 150b is also formed on the upper surface of the image sensor 110.

The alignment marks 150a and 150b may be formed by applying ink to the cover 120 and the image sensor 110. Here, the ink may be black. However, a material and a color of the alignment marks 150a and 150b are not limited thereto. That is, the alignment marks 150a and 150b may also be formed of a metal or a resin, and various colors may be used as a color of the alignment marks 150a and 150b as long as they may be recognized by a measuring apparatus to be described below.

In addition, the alignment marks 150a and 150b may have a shape that may be recognized by the measuring apparatus. For example, the alignment marks 150a and 150b may have shapes of one or multiple characters or patterns, such as a cross (+) shape, a dot shape, or 'L' shape.

In a case in which the alignment marks 150a and 150b are not present, even though the spacer 130 is attached to the image sensor 110 and the upper surface of the cover 120 is inclined due to a thickness difference of the adhesion part 140, it may be difficult to accurately determine a position of the transparent upper surface of the cover 120. Therefore, it may be difficult to measure flatness of the cover 120.

On the other hand, in a case in which the alignment marks 150a and 150b are formed as in one or more embodiments, the flatness of the cover 120 may be measured using the alignment marks 150a and 150b. For example, the flatness of the cover 120 may be decided by measuring a vertical distance from any one plane above the image sensor assembly 100 to respective cover alignment marks 150a and a vertical distance from any one plane above the image sensor assembly 100 to respective image sensor alignment marks 150b and comparing the measured distances with each other. Here, the distances from the above-mentioned plane to the alignment marks 150a and 150b may be measured using a laser distance measuring apparatus, but are not limited thereto.

Figure 11:
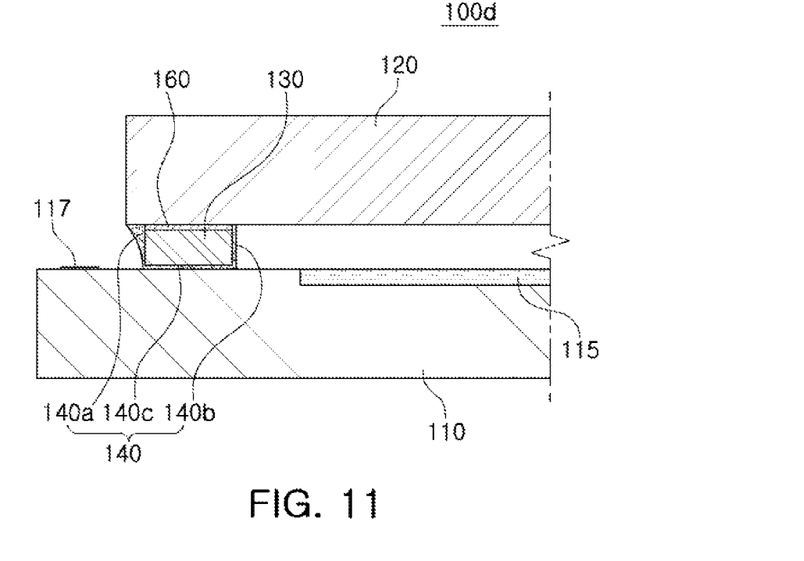
FIG. 11 is a cross-sectional view schematically illustrating an image sensor assembly according to another embodiment.

FIG. 11, a cross-sectional view schematically illustrating an image sensor assembly according to another embodiment, illustrates a cross-section corresponding to a cross-section taken along line A-A of FIG. 1.

Referring to FIG. 11, in an image sensor assembly 100d according to an embodiment, a metal layer 160 may be interposed between the spacer 130 and the cover 120. The metal layer 160 is provided in order to increase adhesion between the spacer 130 and the cover 120, and may be formed of a copper (Cu) thin film or a chrome (Cr) thin film, but is not limited thereto.

The spacer 130 may be formed of a DFR or a PR. In addition, the metal layer 160 is provided in order to increase the adhesion between the spacer 130 formed of the above-mentioned material and the cover 120.

In a case in which the metal layer 160 is formed of the chrome (Cr) thin film, the metal layer 160 may have a surface roughness of 0.744 nm, higher than a surface roughness of the cover 120, about 0.310 nm. Therefore, since an anchor effect is increased on a contact surface between the metal layer 160 and the spacer 130, a coupling force between the metal layer 160 and the spacer 130 may also be increased. In addition, the coupling force between the metal layer 160 and the spacer 130 may also be increased by coordinate covalent bonding between Cr3+ of the metal layer 160 and COO— of the spacer 130. The shear force of the spacer 130 adhered to the cover 120 can withstand is approximately four times greater in a case in which the metal layer 160 is formed than in a case in which the metal layer 160 is not formed. Therefore, it may be appreciated that in a case in which the metal layer 160 is formed, adhesion between the spacer 130 and the cover 120 is significantly improved.

Figure 12A:
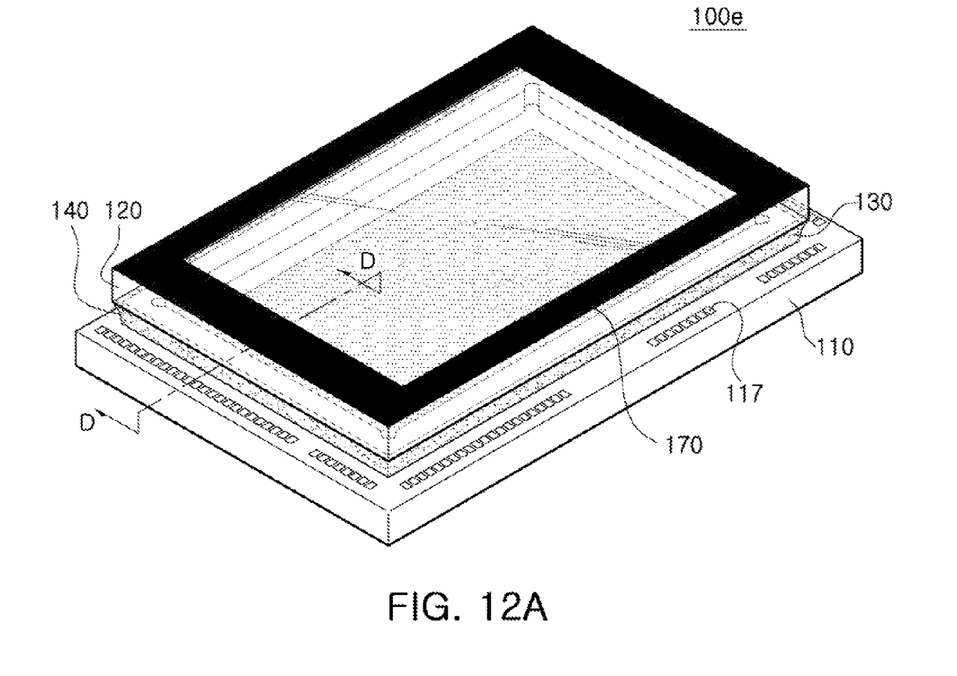
FIG. 12A is a perspective view schematically illustrating an image sensor assembly according to another embodiment.
Figure 12B:
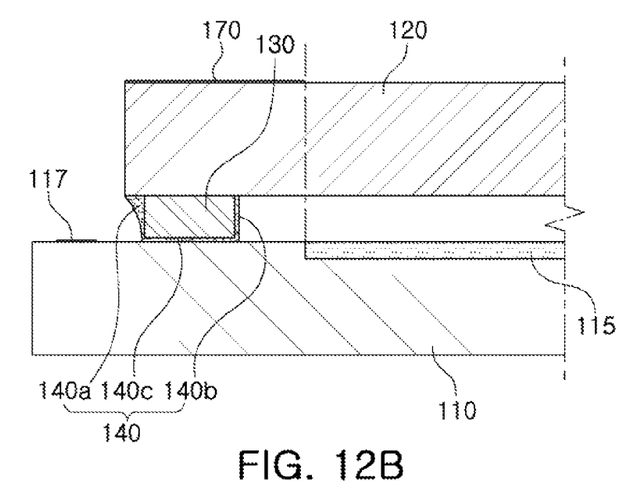
FIG. 12B is a cross-sectional view taken along line D-D of FIG. 12A.

FIG. 12A is a perspective view schematically illustrating an image sensor assembly according to another embodiment; and FIG. 12B is a cross-sectional view taken along line D-D of FIG. 12A.

Referring to FIGS. 12A and 12B, in an image sensor assembly 100e according to an embodiment, a masking part 170 may be formed on the upper surface of the cover 120. The masking part 170 may prevent a flare in the vicinity of the effective pixel region 115 of the image sensor 110. Therefore, the masking part 170 is formed along a perimeter of the effective pixel region 115 on the upper surface of the cover 120. In more detail, when the effective pixel region 115 is projected on the cover 120, the masking part 170 may be formed outwardly of the projected effective pixel region.

However, the masking part 170 is not limited thereto, may also be formed to partially include an edge portion of the projected effective pixel region in consideration of an angle of incident light. In addition, the masking part 170 may be formed at the entire outer side of the projected effective pixel region, but is not limited thereto. That is, the masking part 170 may also be partially formed at the outer side of the projected effective pixel region. Additionally, the masking part 170 may be further formed on a lateral side surface of the cover 120.

The masking part 170 may be formed by applying ink to the surfaces of the cover 120 to be covered to prevent flare, such as the upper surface and side lateral surface. Here, the ink may be black. However, a material and a color of the masking part 170 are not limited thereto. That is, the masking part 170 may also be formed of a metal or a resin, and various colors may be used as a color of the masking part 170 as long as they substantially block undesired light from being introduced into the cover 120.

In the image sensor assembly 100e, since an interval between the cover 120 and the image sensor 110 is very small, a distance between the masking part 170 and the image sensor 110 may also be significantly reduced in a case in which the masking part 170 is formed on the cover 120. Therefore, since undesired light introduced between the masking part 170 and the image sensor 110 may be substantially blocked, generation of a flare may be suppressed.

Figure 13:
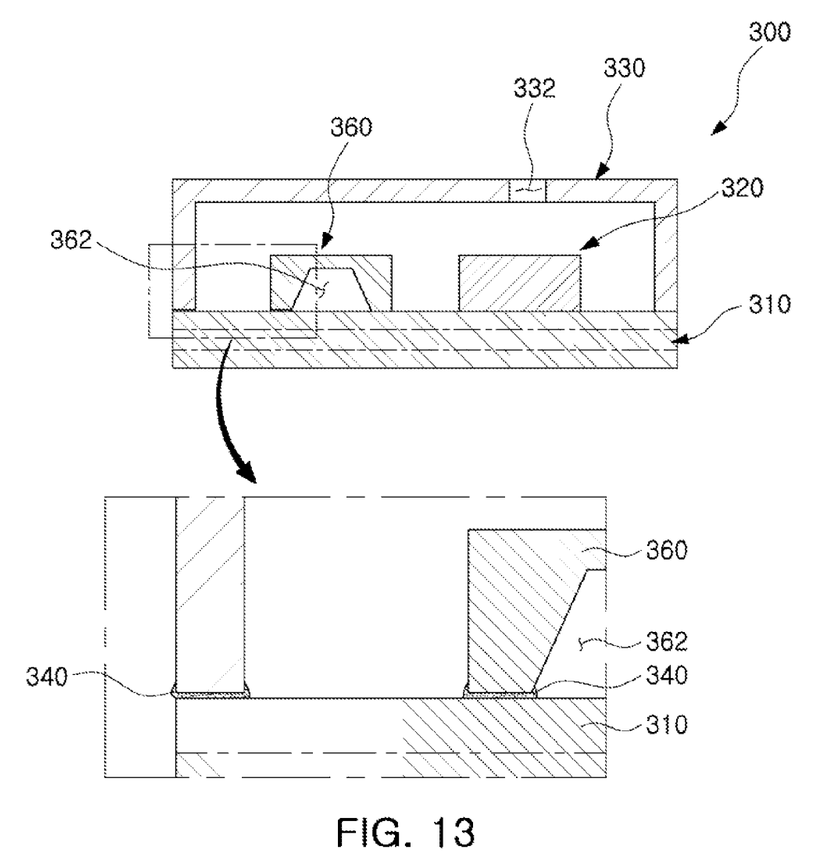
FIG. 13 is a cross-sectional view schematically illustrating an electronic module according to another embodiment in the present disclosure.

FIG. 13 is a cross-sectional view schematically illustrating an electronic module according to another embodiment.

Referring to FIG. 13, the electronic module according to an embodiment, a microphone package, may include a package substrate 310, a sound device 360, an electronic device 320, and a cover 330. In addition, the microphone package 300 according to an embodiment may further include other devices required for operating the sound device 360. The microphone package 300 may be mounted in a portable electronic apparatus, sense a sound including audio, and convert the sensed sound into an electrical signal.

As the package substrate 310, a first component, various kinds of substrates (for example, a ceramic substrate, a printed circuit board (PCB), or a flexible substrate, art may be used. In addition, the package substrate 310 may have mounting electrodes or wiring patterns formed on at least one surface thereof, wherein the mounting electrodes are provided in order to mount the sound device 360 or the electronic device 320 and the wiring patterns electrically connect the mounting electrodes to each other.

The package substrate 310 may be a multilayer substrate including a plurality of layers, and circuit patterns for forming an electrical connection may be formed between the plurality of layers. However, the package substrate is not limited to the multilayer substrate, and may be a single-layer substrate.

An external terminal may be bonded to a lower surface of the package substrate 310. In addition, one or more electronic components may be mounted on or embedded in the package substrate 310. Here, the electronic components may include both of a passive device and an active device.

The sound device 360 may be a silicon condenser microphone device, and may be manufactured in micro electro mechanical systems (MEMS) process. The sound device 360 converts a sound into an electrical signal using a capacitance changed depending on movement of a diaphragm vibrated by the sound. To this end, the sound device 360 includes the diaphragm and a back plate, and has a groove 362 formed inwardly (or upwardly) in a lower surface thereof. Here, the groove 362 may be a back cavity included in the sound device 360 itself.

The electronic device 320 may be an application-specific integrated circuit (ASIC). Therefore, the electronic device is not limited thereto, but may be other general electronic devices or semiconductor devices.

The sound device 360 and the electronic device 320 may be electrically connected to each other through a wiring pattern, a bonding wire, or the like, of the package substrate 310. The cover 330 may be formed of a metal. However, the cover 330 is not necessarily formed of the metal, but may be formed of a resin mixture containing metal powder particles, if desired. The cover 330 covers the sound device 360 and the electronic device 320, thereby protecting the sound device 360 and the electronic device 320 from an unwanted electromagnetic wave. In addition, the cover 330 has at least one sound hole 332 formed therein. The sound hole 332 provides a path through which the sound is introduced.

In the microphone package 300, the sound device 360, the cover 330, or both, are bonded to the package substrate 310 through an adhesion part 340. The adhesion part 340 may be formed of the same material as that of the adhesion part 140 described above.

In addition, the sound device 360 or the cover 330 may be bonded to the package substrate 310 in the dipping scheme described above. For example, a lower end of the sound device 360 or the cover 330 is dipped in the dipping container 3, as illustrated in FIG. 5, to apply the adhesive 5 to a lower end surface of the sound device 360 or the cover 330, the lower end surface of the sound device 360 or the cover 330 to which the adhesive 5 is applied is disposed on the package substrate 310, and the adhesive 5 is hardened, or cured, thereby adhering, or bonding, the sound element 360 or the cover 330 and the package substrate 310 to each other.

In this case, unwanted dispersal of an adhesion surface between the adhesion part 340 and the package substrate 310 may be prevented, similar to the embodiments described above. In addition, the microphone package may be very easily manufactured.

Although a case in which the electronic module is the microphone package has been described by way of example only, the electronic module according to the present description is not limited thereto. For example, the electronic module may include various MEMS packages or sensor packages in which an MEMS device such as a pressure sensor is adhered as a second component to the package substrate.

As set forth above, in the electronic module according to one or more embodiments, since the distance between the effective pixel region and the electrodes formed in the image sensor may be significantly reduced, the size of the image sensor or the image sensor assembly may also be significantly reduced.

In addition, since the cover is not coupled to the housing as in the related art, but is directly adhered to the image sensor, the distance between the cover and the image sensor may be significantly reduced, such that the height (or the thickness) of the image sensor assembly may also be reduced.

Further, the adhesion part may be formed on the inner and outer side surfaces of the spacer and be adhered to the cover, thereby increasing reliability of the adhesion between the cover and the image sensor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. An electronic module comprising:
   a mounting surface;
   a cover disposed above the mounting surface, wherein the cover comprises a protruding portion extending from a lower surface of the cover to a predetermined distance; and an adhesion part adhering the protruding portion to the mounting surface, wherein the adhesion part comprises,
a lower adhesion part interposed between the protruding portion and the mounting surface,
an outer adhesion part on an outer side surface of the protruding portion, and
an inner adhesion part disposed on an inner side surface of the protruding portion, wherein the inner adhesion part is thinner than the outer adhesion part.

2. The electronic module of claim 1, wherein a lower end of the outer adhesion part is connected to the lower adhesion part, and an upper end of the outer adhesion part is adhered to an adhesion surface of the cover.

3. The electronic module of claim 2, wherein the upper end of the outer adhesion part is thicker than the lower adhesion part.

4. The electronic module of claim 1, wherein the protruding part has a quadrangular frame shape, and comprises an accommodating groove formed in at least one corner.

5. The electronic module of claim 1, wherein the protruding part comprises at least one vent hole through which air of an internal space is discharged.

6. The electronic module of claim 1, wherein the mounting surface is an upper surface of an image sensor, the image sensor comprises electrodes disposed along a perimeter of an effective pixel region, and
the protruding part is a spacer disposed between the effective pixel region and the electrodes.

7. The electronic module of claim 6, further comprising:
a masking part formed on one surface of the cover and configured to block a portion of light from being introduced into the effective pixel region of the image sensor.

8. The electronic module of claim 1, wherein the protruding part comprises stacked resin layers.

9. The electronic module of claim 1, further comprising:
a metal layer interposed between the protruding part and the cover to increase a coupling force between the protruding part and the cover.

10. The electronic module of claim 1, further comprising:
an alignment mark formed on one surface of the cover and configured to measure flatness of the cover.

11. The electronic module of claim 1, further comprising:
a sound device disposed on the mounting surface, and a second adhesion part adhering the sound device to the mounting surface.

12. A method of manufacturing an electronic module, comprising:
dipping into an adhesive a lower end surface of a second component comprising an internal space;
disposing the second component onto a first component; and
curing the adhesive to form a bond between the first component and the second component,
wherein the adhesive is formed thinner on one surface of the second component than on a second surface of the second component.

13. The method of claim 12, wherein the first component is an image sensor, and the second component is a transparent cover comprising a spacer attached to a lower surface thereof.

14. The method of claim 13, wherein the curing of the adhesive comprises applying heat to the adhesive or irradiating the adhesive with ultraviolet radiation.

15. The method of claim 12, wherein the first component is a package substrate, and the second component is a micro electro mechanical systems (MEMS) device manufactured in a MEMS process.

16. The method of claim 15, further comprising dipping into an adhesive a cover and disposing the dipped cover onto the package substrate.

17. The method of claim 12, further comprising dipping a third component into an adhesive, and disposing the third component onto the first component,
wherein the first component is a substrate, the second component is a sound device, and the third component is a cover comprising a protrusion extending from a lower surface of the cover.

18. A camera module comprising:
a substrate;
a housing disposed on the substrate;
an electronic module disposed on the substrate and within the housing; and
a lens part comprising a lens disposed in the housing, wherein the electronic module comprises an image sensor, a cover disposed above the image sensor, wherein the cover comprises a spacer extending from a lower surface of the cover at a predetermined distance, and an adhesion part adhering the spacer to the image sensor, wherein the adhesion part comprises,
a lower adhesion part interposed between the spacer and the substrate,
an outer adhesion part on an outer side surface of the spacer, and
an inner adhesion part disposed on an inner side surface of the spacer, wherein the inner adhesion part is thinner than the outer adhesion part.

19. The camera module of claim 18, wherein the spacer comprises a rectangular frame disposed between a perimeter of an effective pixel region of the image sensor and an outer perimeter of the cover.

20. The camera module of claim 18, wherein the adhesion part further comprises:
the inner adhesion part extending between the cover and the image sensor, and
the outer adhesion part is disposed on an outer surface of the spacer and lower surface of the cover, and is configured to extend between the cover and the image sensor,
wherein an upper portion of the outer adhesion part is thicker than a lower portion of the adhesion part.

* * * * *